United States Patent
Tu et al.

(10) Patent No.: US 11,694,820 B2
(45) Date of Patent: Jul. 4, 2023

(54) RADIATION SOURCE APPARATUS AND METHOD FOR USING THE SAME

(71) Applicant: TAIWAN SEMICONDUCTOR MANUFACTURING COMPANY, LTD., Hsinchu (TW)

(72) Inventors: Wei-Chung Tu, Hsinchu (TW); Sheng-Kang Yu, Hsinchu (TW); Shang-Chieh Chien, New Taipei (TW); Li-Jui Chen, Hsinchu (TW); Heng-Hsin Liu, New Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 120 days.

(21) Appl. No.: 17/407,291

(22) Filed: Aug. 20, 2021

(65) Prior Publication Data
US 2022/0359097 A1 Nov. 10, 2022

Related U.S. Application Data

(60) Provisional application No. 63/185,612, filed on May 7, 2021.

(51) Int. Cl.
| | |
|---|---|
| *G21K 1/06* | (2006.01) |
| *G02B 5/08* | (2006.01) |
| *G02B 5/10* | (2006.01) |
| *G03F 7/20* | (2006.01) |
| *H05G 2/00* | (2006.01) |
| *G03F 7/00* | (2006.01) |

(52) U.S. Cl.
CPC .......... *G21K 1/06* (2013.01); *G02B 5/0808* (2013.01); *G02B 5/0891* (2013.01); *G02B 5/10* (2013.01); *G03F 7/70025* (2013.01); *G03F 7/70033* (2013.01); *H05G 2/008* (2013.01)

(58) Field of Classification Search
CPC ...... G21K 1/06; G02B 5/0808; G02B 5/0891; G02B 5/10; G02B 17/0663; G03F 7/70033; G03F 7/70025; H05G 2/008; H05G 2/005; H05G 2/006
USPC ..................................................... 250/504 R
See application file for complete search history.

(56) References Cited

U.S. PATENT DOCUMENTS

| | | | | |
|---|---|---|---|---|
| 7,482,609 B2 * | 1/2009 | Ershov | ............... | H05G 2/005 |
| | | | | 372/18 |
| 2018/0317308 A1 * | 11/2018 | Chang | ............... | H05G 2/005 |
| 2022/0334472 A1 * | 10/2022 | Tsai | ............... | G03F 7/70175 |

* cited by examiner

*Primary Examiner* — Kiet T Nguyen
(74) *Attorney, Agent, or Firm* — Birch, Stewart, Kolasch & Birch, LLP

(57) ABSTRACT

A radiation source apparatus includes a vessel, a laser source, a collector, and a reflective mirror. The vessel has an exit aperture. The laser source is at one end of the vessel and configured to excite a target material to form a plasma. The collector is disposed in the vessel and configured to collect a radiation emitted by the plasma and to direct the collected radiation to the exit aperture of the vessel. The reflective mirror is in the vessel and configured to reflect the laser beam toward an edge of the vessel.

20 Claims, 13 Drawing Sheets

RADIATION SOURCE APPARATUS AND METHOD FOR USING THE SAME

PRIORITY CLAIM AND CROSS-REFERENCE

This application claims priority to U.S. Provisional Application Ser. No. 63/185,612, filed May 7, 2021, which is herein incorporated by reference in its entirety.

BACKGROUND

Photolithography is a process by which a reticle having a pattern is irradiated with light to transfer the pattern onto a photosensitive material overlying a semiconductor substrate. Over the history of the semiconductor industry, smaller integrated chip minimum features sizes have been achieved by reducing the exposure wavelength of optical lithography radiation sources to improve photolithography resolution. Extreme ultraviolet (EUV) lithography, which uses extreme ultraviolet (EUV) light, is a promising next-generation lithography solution for emerging technology nodes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
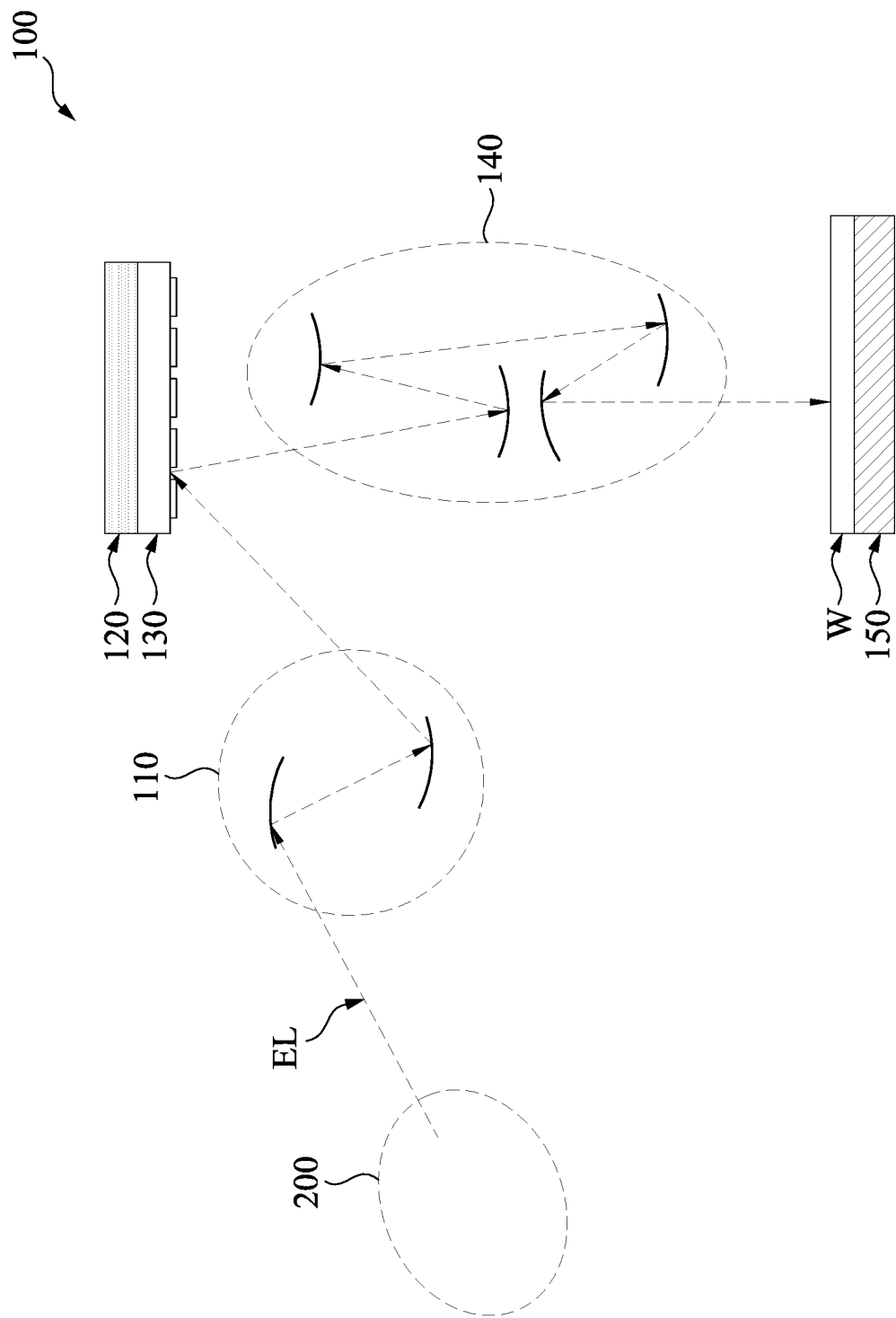
FIG. 1 is a schematic view of a lithography system according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The advanced lithography process, method, and materials described in the embodiments of the present disclosure can be used in many applications, including fin-type field effect transistors (FinFETs). For example, the fins may be patterned to produce a relatively close spacing between features, for which the above disclosure is well suited. In addition, spacers used in forming fins of FinFETs can be processed according to some embodiments of the present disclosure.

An extreme ultraviolet (EUV) photolithography system uses extreme ultraviolet radiation. One method of producing the extreme ultraviolet radiation is to emit a laser to droplets of tin. As the tin droplets are produced into the EUV radiation source vessel, the laser hits the tin droplets and heats the tin droplets to a critical temperature that causes atoms of tin to shed their electrons and become a plasma of ionized tin droplets. The ionized tin droplets emit photons, which is collected by a collector and provided as EUV radiation to an optical lithography system.

FIG. 1 is a schematic view of a lithography system 100 according to some embodiments of the present disclosure. The lithography system 100 may also be referred to as a scanner that is operable to perform lithography exposing processes with respective radiation source and exposure mode. In some embodiments, the lithography system 100 is an extreme ultraviolet (EUV) lithography system designed to expose a resist layer by EUV light (or EUV radiation). The resist layer is a material sensitive to the EUV light. The EUV lithography system 100 employs a radiation source 200 to generate EUV light EL, such as EUV light having a wavelength ranging between about 1 nm and about 100 nm. In certain examples, the EUV light EL has a wavelength range centered at about 13.5 nm. Accordingly, the radiation source 200 is also referred to as an EUV radiation source 200. The EUV radiation source 200 may utilize a mechanism of laser-produced plasma (LPP) to generate the EUV radiation.

The lithography system 100 also employs an illuminator 110. In some embodiments, the illuminator 110 includes various reflective optics such as a single mirror or a mirror system having multiple mirrors in order to direct the EUV light EL from the radiation source 200 onto a mask stage 120, particularly to a mask 130 secured on the mask stage 120.

The lithography system 100 also includes the mask stage 120 configured to secure the mask 130. In some embodiments, the mask stage 120 includes an electrostatic chuck (e-chuck) used to secure the mask 130. In this context, the terms mask, photomask, and reticle are used interchangeably. In the present embodiments, the lithography system 100 is an EUV lithography system, and the mask 130 is a reflective mask. One exemplary structure of the mask 130 includes a substrate with a low thermal expansion material (LTEM). For example, the LTEM may include $TiO_2$ doped $SiO2$, or other suitable materials with low thermal expansion. The mask 130 includes a reflective multi-layer deposited on the substrate. The reflective multi-layer includes plural film pairs, such as molybdenum-silicon (Mo/Si) film pairs (e.g., a layer of molybdenum above or below a layer of silicon in each film pair). Alternatively, the reflective multi-layer may include molybdenum-beryllium (Mo/Be) film pairs, or other suitable materials that are configurable to highly reflect the EUV light EL. The mask 130 may further include a capping layer, such as ruthenium (Ru), disposed on the reflective multi-layer for protection. The mask 130 further includes an absorption layer, such as a tantalum boron nitride (TaBN) layer, deposited over the reflective multi-layer. The absorption layer is patterned to define a layer of an integrated circuit (IC). The mask 130 may have other structures or configurations in various embodiments.

The lithography system 100 also includes a projection optics module (or projection optics box (POB)) 140 for imaging the pattern of the mask 130 onto a semiconductor substrate W secured on a substrate stage (or wafer stage) 150 of the lithography system 100. The POB 140 includes reflective optics in the present embodiments. The light EL that is directed from the mask 130 and carries the image of the pattern defined on the mask 130 is collected by the POB 140. The illuminator 110 and the POB 140 may be collectively referred to as an optical module of the lithography system 100.

In the present embodiments, the semiconductor substrate W is a semiconductor wafer, such as a silicon wafer or other type of wafer to be patterned. The semiconductor substrate W is coated with a resist layer sensitive to the EUV light EL in the present embodiments. Various components including those described above are integrated together and are operable to perform lithography exposing processes.

Figure 2A:
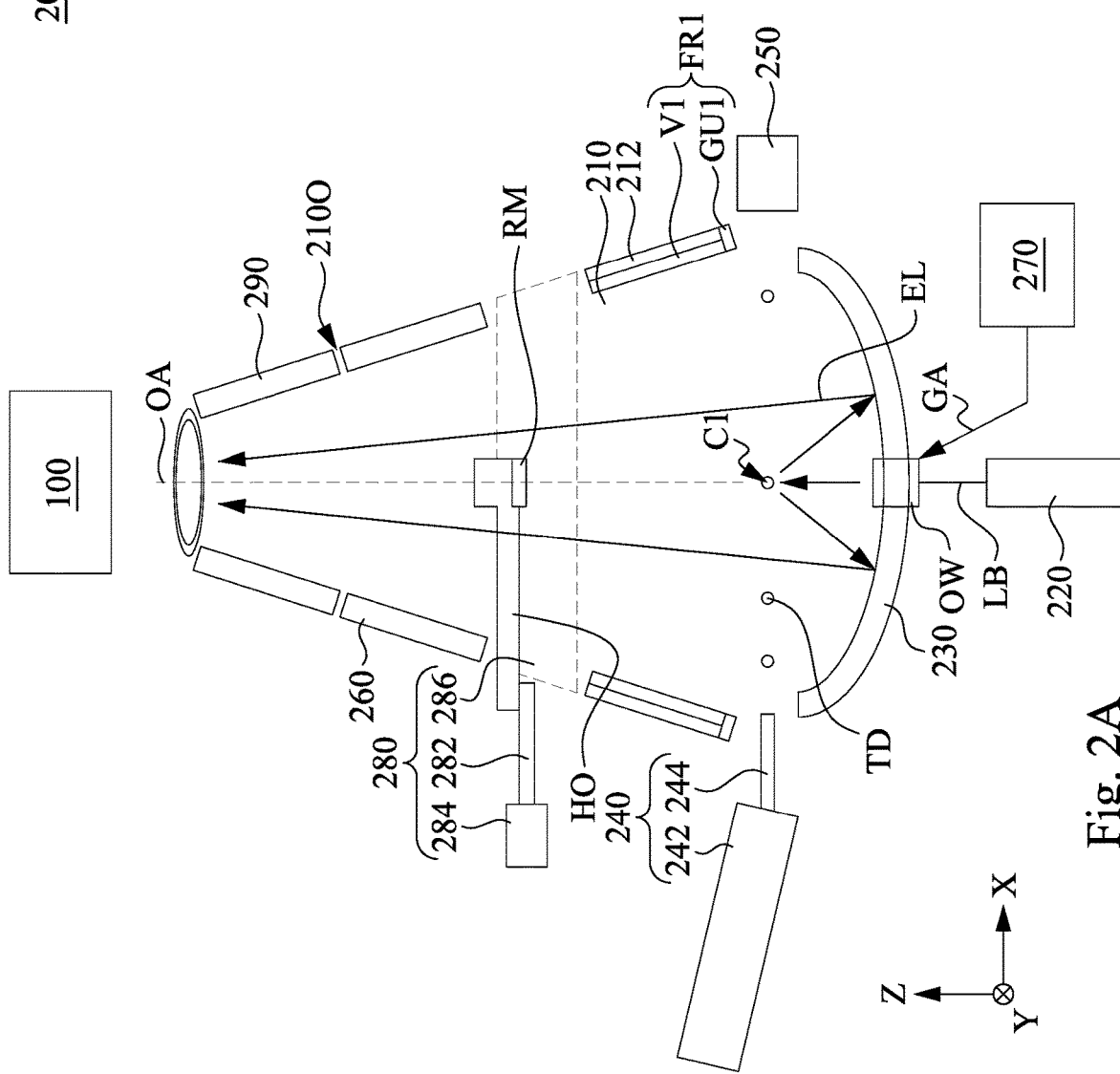
FIGS. 2A and 2B are schematic views of an EUV radiation source viewed from its different sides according to some embodiments of the present disclosure.
Figure 2B:
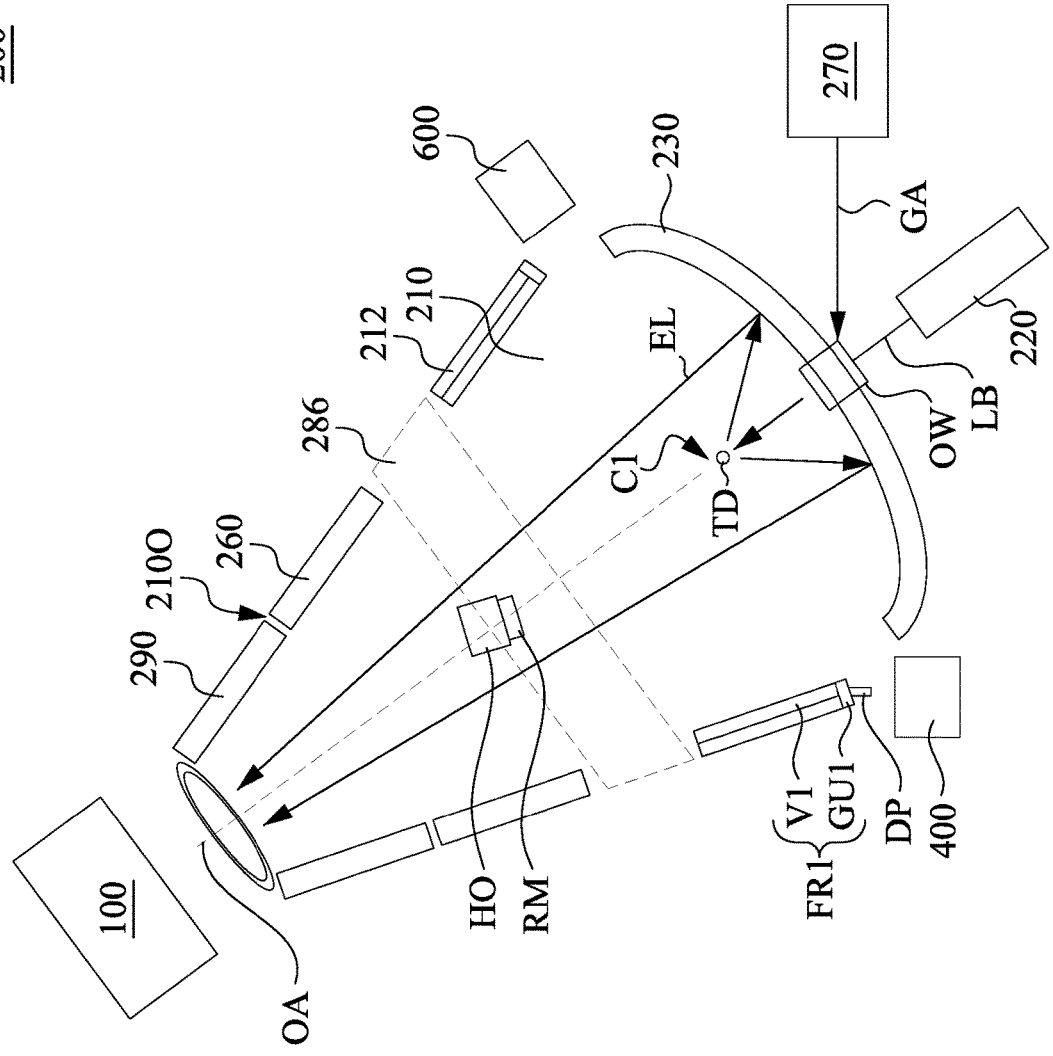

FIGS. 2A and 2B are schematic views of an EUV radiation source 200 viewed from its different sides according to some embodiments of the present disclosure. For example, the EUV radiation source 200 emits EUV light EL substantially along a direction Z, and the EUV radiation source 200 is viewed along direction Y in FIG. 2A, and viewed along direction X in FIG. 2B. In some embodiments, the direction X, Y, and Z are orthogonal to each other, and the direction Z is inclined with respect to a direction of gravity (i.e., a direction G in FIG. 2B.

Reference is made to FIG. 2A. The EUV radiation source 200 may include a vessel 210, a laser source 220, a collector 230, a target droplet generator 240, a droplet catcher 250, and a lower cone structure 260. In some embodiments, the vessel 210 has a cover 212 surrounding itself, and the cover 212 is around the collector 230. The droplet generator 240 and the droplet catcher 250 may be installed on opposite sides of the vessel 210, in which the droplet generator 240 is configured to generate droplets of the fuel material TD, and the droplet catcher 250 is configured to receive the droplets of the fuel material TD. The laser source 220 may be at a bottom side of the vessel 210 and below the collector 230 and configured to generate laser beam LB. The laser beam LB is directed to heating the droplets of fuel material TD, such as tin droplets, thereby generating high-temperature plasma (e.g., ionized tin droplets) which further produces the EUV light EL. The collector 230 may collect the EUV light EL, and reflect and focus the EUV light EL to the scanner (i.e., the lithography system 100). In some embodiments, the lower cone structure 260 has a cone shape with its wide base integrated with the cover 212 and its narrow top section facing the scanner (i.e., the lithography system 100). The cone shape of the lower cone structure 260 tapers toward an exit aperture 2100 of the vessel 210. In some embodiments, the radiation source 200 may further include an intermediate focus (IF)-cap module 290 out of the exit aperture 2100, and the IF-cap module 290 is configured to provide intermediate focus to the EUV radiation EL.

In some embodiments, the EUV radiation source 200 further includes the horizontal obscuration bar HO configured to obscure the laser beam LB, thereby preventing the laser beam LB from emitting out of the vessel 210 through the exit aperture 2100. The horizontal obscuration bar HO may have an end fixed to a lower side of the cone structure 260.

Reference is made to FIG. 2B. The EUV radiation source 200 may further include a fuel receiving assembly FR1 on an inner sidewall of the cover 212 and one or more drip pins DP connected to a bottom of the fuel receiving assembly FR1. In some embodiments, the high-temperature plasma (e.g., ionized tin) may cool down and become vapors or small particles, which may be collectively referred to as debris. In other words, residues of plasma may be collectively referred to as debris. The fuel receiving assembly FR1 may include vanes V1 surrounding the vessel 210 and a gutter structure GU1 below the vanes V1. The vanes V1 of the fuel receiving assembly FR1 may extend from a top portion of the cover 212 to the gutter structure GU1, and evenly spaced around the vessel 210. The vanes V1 may receive the liquid debris and direct the liquid debris downward to the gutter structure GU1. The gutter structure GU1 may have drain holes (e.g., the drain holes GO1 in FIGS. 4A and 4B) fluidly communicated with the drip pins DP. The drip pins DP may guide debris liquid away from the cover 212, for example, to a fuel bucket 400. The fuel bucket 400 can collect liquid debris. Through the configuration, the liquid debris received by the vanes V1 may flow into the fuel bucket 400 through the drain holes of the gutter structure GU1 and the drip pins DP.

In some embodiment, the EUV radiation source 200 is tilted with respect to the direction of gravity (i.e., a direction G), such that the fuel bucket 400 is at a lower position than positions of the droplet generator 240 and the droplet catcher 250, which may facilitate tin collection. In some cases, the debris liquid may get solidified, causing clogging in the drip pins DP, which in turn may fail draining the debris liquid and cause contamination on the collector 230.

In some embodiments of the present disclosure, the radiation source 200 may include a reflective mirror RM mounted on a front end of the horizontal obscuration bar HO. The reflective mirror RM may be capable of reflecting the laser beam LB, for example, to a region near an edge of the vessel 210. In some embodiments of the present disclosure, for addressing the clogging in the drip pins DP, the reflective mirror RM may reflect the laser beam LB toward the drip pins DP, thereby heating the drip pins DP and keeping the debris liquid in the drip pins DP from getting solidified. In greater detail, the reflected mirror RM is oriented such that the drip pins DP are located on a reflection path of the laser beam LB, which allows for heating the drip pins DP by using the laser beam LB coming from the laser source 220, without adding an additional heat source.

Figure 3:
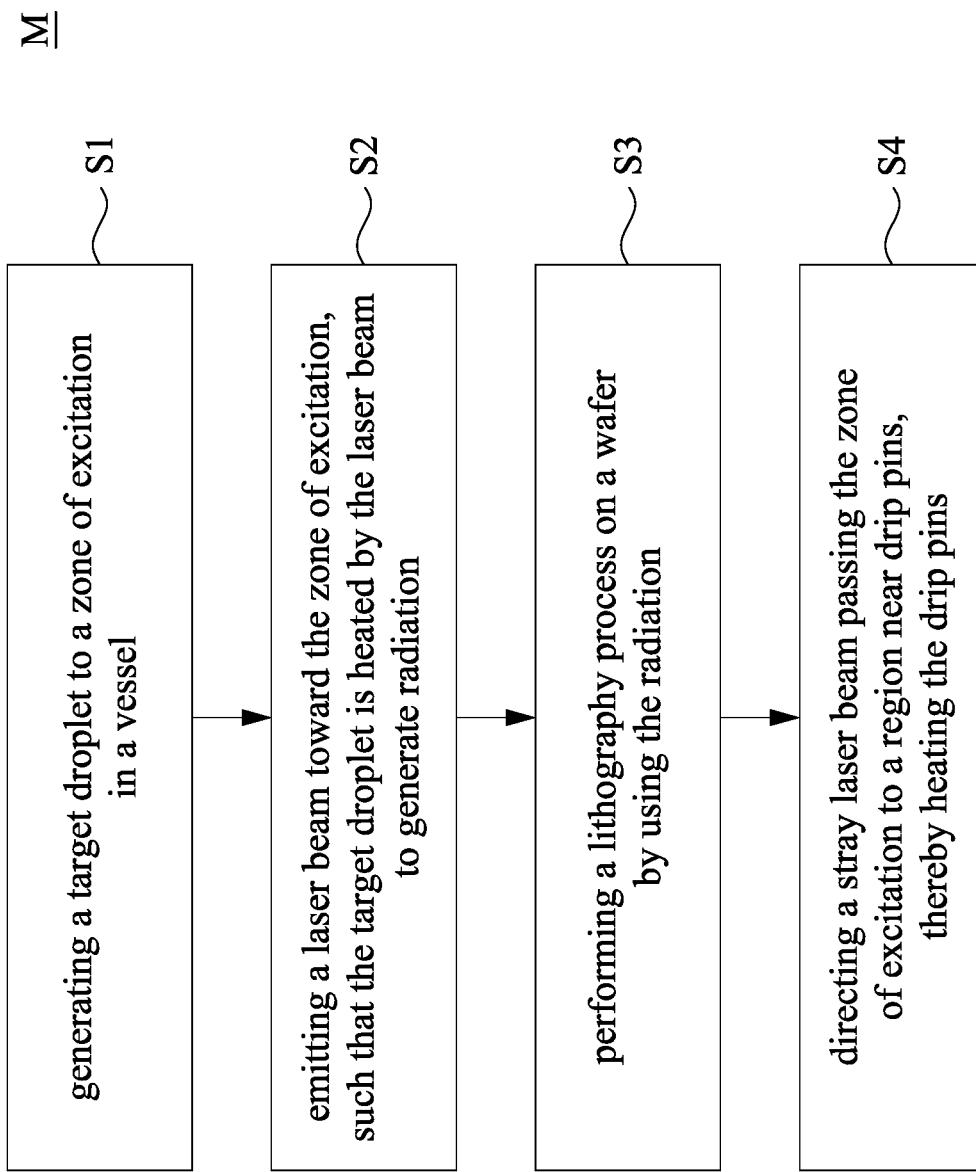
FIG. 3 is a flow chart of a method for using an EUV radiation source according to some embodiments of the present disclosure.

FIG. 3 is a flow chart of a method M for using the EUV radiation source 200 according to some embodiments of the present disclosure. The method M may include steps S1-S4. At step S1, a target droplet is generated to a zone of excitation in a vessel. At step S2, a laser beam is emitted toward the zone of excitation, such that the target droplet is heated by the laser beam to generate radiation. At step S3, a lithography process is performed on a wafer by using the radiation. At step S4, a stray laser beam passing the zone of excitation is directed to a region near drip pins, thereby heating the drip pins. It is understood that additional steps may be provided before, during, and after the steps S1-S4 shown by FIG. 3, and some of the steps described below can be replaced or eliminated for additional embodiments of the method. The order of the operations/processes may be interchangeable. For example, the droplet ejecting step (i.e., step S1) can be initiated after laser emitting step (i.e., step S2) is initiated, which in turn reduces unmelt tin droplets.

Reference is made to FIGS. 3, 2A, and 2B. The method M begins at step S1, where a target droplet is generated to a plasma-formation point C1 (interchangeably referred to as zone of excitation where droplets are excited by laser) in the vessel 210. For example, droplets of the fuel material TD may be ejected from the droplet generator 240 to the plasma-formation point C1 in front of the collector 230. In some embodiments, the plasma-formation point C1 may substantially locate at an optic axis OA of the collector 230 along the Z direction. In some embodiments, the droplet generator 240 may include a reservoir 242 and a nozzle 244 connected to the reservoir 242. In some embodiments, the reservoir 242 may contain a suitable fuel material TD that is capable of creating a radiation in the EUV range when being converted to a plasma state. For example, the fuel material TD may include water, tin, lithium, xenon, or the like. In some embodiments, the element tin can be pure tin (Sn); a tin compound, for example, $SnBr_4$, $SnBr_2$, $SnH_4$; a tin alloy, for example, tin-gallium alloys, tin-indium alloys, tin-indium-gallium alloys, or any other suitable tin-containing material.

Reference is made to FIGS. 3, 2A, and 2B. The method M proceed to step S2, where a laser beam LB is emitted toward the plasma-formation point C1, thereby hitting the droplet of the fuel material TD. In some embodiments, the laser source 220 emitting the laser beam LB may be a pulse carbon dioxide ($CO_2$) laser generator or a gas discharge $CO_2$ laser generator (e.g., producing radiation at about 10.6 μm) that generates the laser beam LB. In some alternative embodiments, other suitable types of lasers may be used. For example, in some alternative embodiments, a neodymium-doped yttrium aluminum garnet (Nd:YAG) laser may be used.

The laser beam LB is directed through an output window OW integrated with the collector 230. The output window OW adopts a suitable material that is substantially transparent to the laser beam LB. In some embodiments, the optic axis OA of the collector 230 passes through the output window OW, and a central ray axis of the laser beam LB is parallel and overlapping the optic axis OA of the collector 230. Through the configuration, the laser beam LB is directed to heating the droplets of the fuel material TD at the plasma-formation point C1, thereby generating high-temperature plasma (e.g., ionized tin droplets) which further produces the EUV light EL. In some embodiments, the pulses of the laser source 220 and the droplet ejecting rate of the droplet generator 240 are controlled to be synchronized, such that the fuel material TD receives peak power consistently from the laser pulses of the laser source 220. In some embodiments, the EUV radiation source 200 employs a laser produced plasma (LPP) mechanism to generate plasma and further generate EUV light EL from the plasma. In some alternative embodiments, the radiation source 200 may employ a dual LPP mechanism in which the laser source 220 is a cluster of multiple laser sources.

Reference is made to FIGS. 3, 2A, 2B, and FIG. 1. The method M proceed to step S3, where a lithography process is performed on the wafer (e.g., the substrate W) by using the radiation EL. In some embodiments, the wafer (e.g., the substrate W) is coated with a photosensitive material. The radiation EL generated by the EUV radiation source 200 may be directed to the mask 130 by the illuminator 110, and therefore carries a pattern of the mask 130. The radiation EL carrying the pattern may be directed to the wafer (e.g., the substrate W) through the POB 140, thereby exposing portions of the photosensitive material on the wafer (e.g., the substrate W). The exposed photosensitive material may then be developed, for example, immersed in a photoresist developer. The photosensitive material may be a positive photoresist or a negative photoresist. For the positive photoresist, the portion of the photoresist that is exposed to radiation EL becomes soluble to the photoresist developer, and the unexposed portion of the photoresist remains insoluble to the photoresist developer. For the negative photoresist, the portion of the photoresist that is exposed to the radiation EL becomes insoluble to the photoresist developer, and the unexposed portion of the photoresist is dissolved by the photoresist developer. After the developing process, a baking process may be performed. Through these processes, a pattern of the mask 130 is transferred to the photosensitive material. The patterned photosensitive material may serve as an etch mask for an etching process to the wafer (e.g., the substrate W), thereby transferring the pattern to the wafer (e.g., the substrate W).

Reference is made back to FIGS. 2A and 2B. During the generation of the EUV radiation EL, the laser beam LB may or may not hit every droplet of the fuel material TD. For example, some droplets of the fuel material TD may be purposely missed by the laser beam LB. In the present embodiments, the droplet catcher 250 is installed opposite the target droplet generator 240 and in the direction of the movement of the droplet of the fuel material TD. The droplet catcher 250 is configured to catch any droplets of the fuel material TD that are missed by the laser beam LB.

When the laser beam LB heats the tin droplet, due to the limited conversion efficiency, a portion of the laser beam LB hitting the tin droplets may not be absorbed by the tin droplets. Also, in some embodiments, a portion of the laser beam LB may intentionally miss the tin droplets. In the context, after passing the plasma-formation point C1, the unabsorbed laser beam LB or/and the intentionally missed laser can be referred to as a stray laser beam LBS.

Figure 4A:
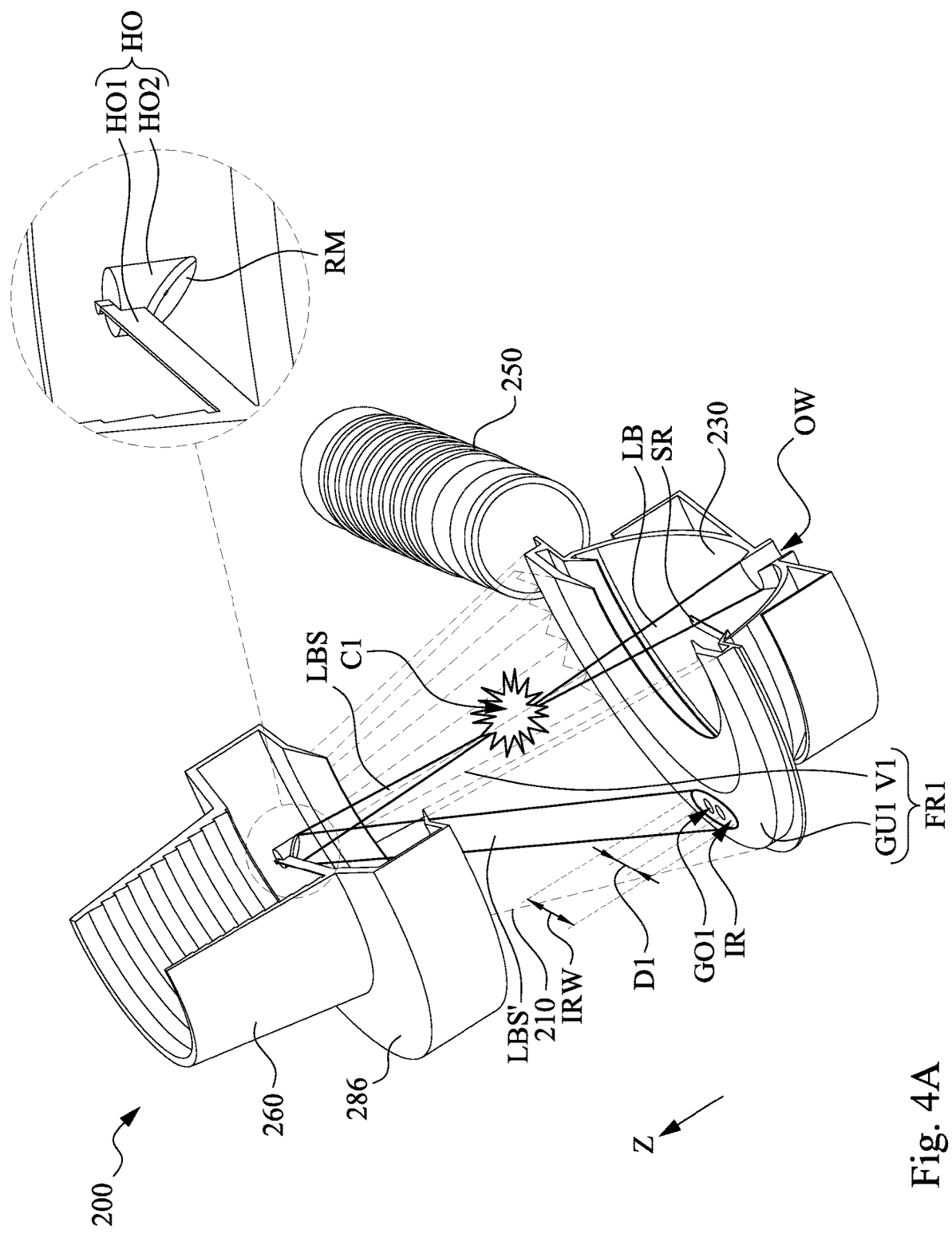
FIG. 4A illustrates an optical path of a laser beam in the EUV radiation source according to some embodiments of the present disclosure.

FIG. 4A illustrates an optical path of a laser beam in the EUV radiation source 200 according to some embodiments of the present disclosure. After passing the plasma-formation point C1, the stray laser beam LBS may propagate along the direction Z and arrive the horizontal obscuration bar HO. In absence of the reflective mirror RM, the stray laser beam LBS may be obscured by the horizontal obscuration bar HO from emitting out of the vessel 210 through the exit aperture 2100. For example, the horizontal obscuration bar HO may have a rough surface for scattering the stray laser beam LBS, which may result in wasted laser. In some embodiments of the present disclosure, the horizontal obscuration bar HO is designed to hold a reflective mirror RM, which is capable of reflecting the stray laser beam LBS toward a target region, e.g., the region near drip pins as discussed above, so as to "reuse" the stray laser to heat the drip pins and thus reduce the wasted laser.

Reference is made to FIGS. 3 and 4A. The method M proceed to step S4, where the stray laser beam LBS is directed to a region near drip pins DP (referring to FIG. 2B), thereby heating the drip pins DP (referring to FIG. 2B). After being reflected by the reflective mirror RM, the stray laser may be referred to as the reflected stray laser beam LBS'. The region irradiated by the stray laser beam LBS' may be referred to as an irradiated region IR. In FIG. 4A, the drip pins DP (referring to FIG. 2B) are below and fluidly communicated with the drain holes GO1 of the gutter structure GU1. The reflected stray laser beam LBS' may heat the drain holes GO1 and/or the drip pins DP (referring to FIG. 2B), thereby preventing the tin flowing through the drip pins DP (referring to FIG. 2B) from solidifying, which in turn may address clogging in the drip pins.

In some embodiments of the present disclosure, the horizontal obscuration bar HO is designed to hold a reflective mirror RM, which is capable of reflecting the stray laser beam LBS toward a region where the drip pins DP (referring to FIG. 2B) may be disposed. In some embodiments, referring to FIGS. 2B and 4A, the reflective mirror RM is directly between the exit aperture 2100 of the vessel 210 and the output window OW of the collector 230. The reflective mirror RM can be supported by suitable means. In the present embodiments, the horizontal obscuration bar HO may have a bar portion HO1 and a head portion HO2 connected to the bar portion HO1. The bar portion HO1 and head portion HO2 may be made of suitable material, such as tungsten. The head portion HO2 may be located at the optic axis OA of the collector 230 along the Z direction. The reflective mirror RM may be mounted on the head portion HO2 and also located at the optic axis OA of the collector 230 along the Z direction. In some other embodiments, the head portion HO2 of the horizontal obscuration bar HO may be omitted, and the reflective mirror RM is connected and supported by the bar portion HO1.

Figure 4B:
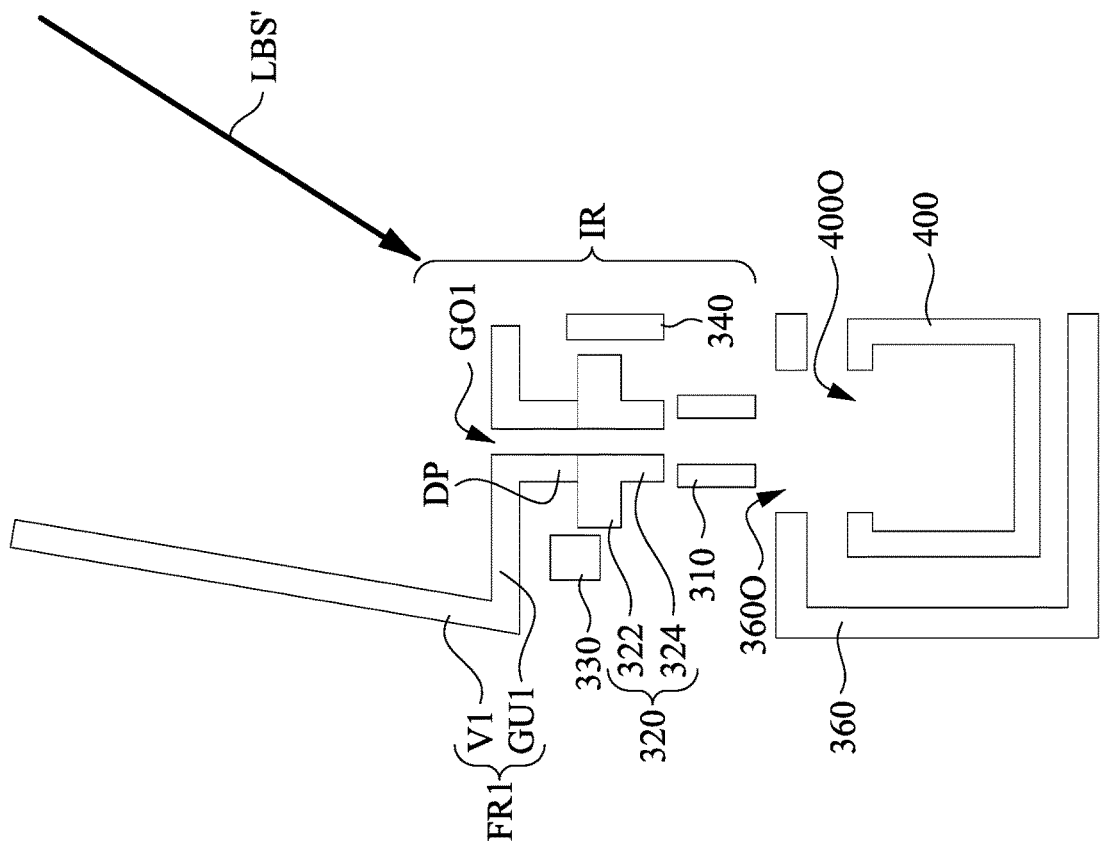
FIG. 4B illustrates a cross sectional view of a portion of EUV radiation source of FIG. 4A.

FIG. 4B is a cross sectional view of the portion of EUV radiation source 200 of FIG. 4A. The EUV radiation source 200 may further include a chimney 310, a thermal conductive feature 320, a heater 330, and a heat shield 340. The chimney 310 may be disposed below the drip pins DP for limiting the dripping of the debris liquid. The chimney 310 may be made of suitable material that the debris liquid is less sticky to, such as ceramics. The thermal conductive feature 320 may be disposed below the gutter structure GU1 and above the chimney 310. The thermal conductive feature 320 may be made of suitable thermal conductive materials, such as aluminum, other metals, or the combination thereof. The thermal conductive feature 320 may have a ring portion 322 surrounding the vessel and below the gutter structure GU1 and an extending pin 324 fluidly communicated with the drip pin DP, thereby extending the length of the drip pin. In some embodiments, the drip pin DP and the extending pin 324 may be collectively referred to as a drip pin. The heater 330 may be located adjacent to the gutter structure GU1 and the thermal conductive feature 320, thereby heating the gutter structure GU1 and the thermal conductive feature 320, and also heating the drip pin DP. The heat shield 340 may be made of suitable thermal insulating materials, such as stainless steel or the like. The heat shield 340 may shield the thermal conductive feature 320, thereby preventing heat loss.

The EUV radiation source 200 may further include a pack structure 360, and the fuel bucket 400 is inserted into the pack structure 360 and is removable from the pack structure 360. For example, the pack structure 360 surrounds five surfaces of the fuel bucket 400 and one surface of the fuel bucket 400 is exposed. The fuel bucket 400 may be retrieved from the exposed surface. In other words, the fuel bucket 400 can be moved in and out of the pack structure 360. The pack structure 360 may include an inlet 3600 aligned with the drip pin DP. The fuel bucket 400 may include an opening 4000 aligned with the inlet 3600 and the drip pin DP for receiving the liquid debris.

In some embodiments, the number of the drain hole GO1 of the gutter structure GU1, the number of the extending pin 324 of the thermal conductive feature 320, the number of the chimney 310, and the number of the inlets 3600 of the pack structure 360 correspond to the number of the drip pin DP. For example, while two drip pins DP are disposed below the gutter structure GU1, the gutter structure GU1 has two drain hole GO1, the thermal conductive feature 320 has two extending pins 324, two chimneys 310 are disposed below the extending pins 324, and the pack structure 360 has two inlets 3600 below the chimneys 310.

In some embodiments of the present disclosure, the irradiated region IR may cover a region where the drain hole GO1 of the gutter structure GU1 is located, a region where the drip pin DP is located, a region where the chimney 310 is located, and/or a region where the extending pin 324 of the thermal conductive feature 320 is located. For example, as view from above along the direction Z, the stray laser beam LBS' is directed to a region near the fuel bucket 400 (referring to FIGS. 2B and 4B) along the direction Y.

In some embodiments, the irradiated region IR may cover some elements of the drain hole GO1 of the gutter structure GU1, the drip pin DP, the chimney 310, and the extending pin 324 of the thermal conductive feature 320, and not cover the other elements of the drain hole GO1 of the gutter structure GU1, the drip pin DP, the chimney 310, and the extending pin 324 of the thermal conductive feature 320. In some embodiments, the irradiated region IR may cover all elements of the drain hole GO1 of the gutter structure GU1, the drip pin DP, the chimney 310, and the extending pin 324 of the thermal conductive feature 320.

Referring is made to FIGS. 4A and 4B. In some embodiments, when two drip pins DP are disposed below the gutter structure GU1, a width IRW of the irradiated region IR is greater than a distance D1 between the drip pins DP. The distance D1 may be a center-to-center distance between the drip pins DP, as shown in FIG. 8B. In some embodiments, the distance D1 may also be a center-to-center distance between the drain holes GO1, a center-to-center distance between the chimneys 310, or a center-to-center distance between the extending pins 324. Through the configuration, the stray laser beam LBS' may heat both drain holes GO1 of the gutter structure GU1, both drip pins DP, both chimneys 310, and/or both extending pins 324 of the thermal conductive feature 320. The width IRW of the irradiated region IR and the distance D1 may be measured along a direction that the two drain holes GO1 or the two drip pins DP are arranged along. For example, the width IRW of the irradiated region IR and the distance D1 may be measured substantially along the direction X.

In some embodiments, by using laser heating, compared with the heater 330, the area to be heated by the laser heating is narrowed down such that the solid tin removal will be more efficient and effective. In some embodiments, for increasing a light intensity of laser in the irradiated region IR, a width IRW of the irradiated region IR may be in a range from about 120 millimeters to about 150 millimeters. For example, the width IRW of the irradiated region IR may be in a range from about 1.2 times the distance D1 to about 1.5 times the distance Dl. If the width IRW is too large, the light intensity of laser in the irradiated region IR may be decreased, and the heating is less efficient and effective. If the width IRW is too small, it may be difficult to transfer the heat to the solid tin in the drip pins.

Reference is made back to FIGS. 2A and 2B. The collector 230 may be designed with suitable coating material and shape, functioning as a mirror for EUV collection, reflection, and focus. In some examples, the coating material of the collector 230 includes a reflective multi-layer (such as a plurality of Mo/Si film pairs) and may further include a capping layer (such as Ru) coated on the reflective multi-layer to substantially reflect the EUV light. An optic axis OA of the collector 230 may be along a direction Z, which is orthogonal to the direction X that the droplet generator 240 generates the droplet of the fuel material TD substantially along, such that the EUV radiation source 200 may emits the EUV light EL substantially along the Z direction. In some examples, the collector 230 is designed to have an ellipsoidal geometry.

The collector 230 may focus the EUV light EL generated by the plasma toward the IF-cap module 290. The IF-cap module 290 is located between the EUV radiation source vessel 210 and the scanner (i.e., the lithography system 100) including optical elements configured to direct the EUV light EL to a workpiece (e.g., a semiconductor substrate). When EUV radiation source 200 emits EUV light EL, the space in the vessel 210 (e.g., the space surrounded the cover 212) is maintained in a vacuum environment to avoid absorption of the EUV radiation by air. The IF-cap module 290 may comprise a cone shaped aperture configured to provide for separation of pressures between the EUV radiation source vessel 210 and the scanner (i.e., the lithography system 100). In some embodiments, the IF-cap module 290 may extend into the scanner (i.e., the lithography system 100).

In some embodiments, the radiation source 200 may further include a gas flow mechanism, including a gas supply module 270, an exhaust system 280, and various pipelines for integrating the gas flow mechanism with the collector 230. The gas supply module 270 is configured to provide a gas GA into the vessel 210 and particularly into a space proximate the reflective surface of the collector 230. In some embodiments, the gas GA is hydrogen gas, which has less absorption to the EUV radiation. Other suitable gas may be alternatively or additionally used. The gas GA is provided for various protection functions, which include effectively protecting the collector 230 from the contaminations by tin particles. The gas GA may be introduced into the collector 230 through openings (or gaps) near the output window OW through one or more gas pipelines.

In some embodiments, the exhaust system 280 includes one or more exhaust lines 282 and one or more pumps 284. The exhaust line 282 may be connected to the wall of the vessel 210 for receiving the exhaust. In some embodiments, the cover 212 is designed to have a cone shape with its wide base integrated with the collector 230 and its narrow top section facing the illuminator 110. To further these embodiments, the exhaust line 282 is connected to the cover 212 at its top section. The pump 284 draws airflow from the vessel 210 into the exhaust line 282 for effectively pumping out the gas GA. The gas GA may also function to carry some debris away from the collector 230 and the cover 212 and into the exhaust system 280. In some embodiments, the exhaust system 280 may include a gas outlet structure 286 disposed at the entrance of the exhaust line 282. The gas outlet structure 286 may be a scrubber, which may scrub gas vapors or dilute the exiting gas before the gas is released out of the vessel 210. For example, the gas GA may carry the debris away from the collector 230 and into the gas outlet structure 286. In some embodiments, while an end of the horizontal obscuration bar HO is fixed to a lower side of the cone structure 260 and may be connected to an upper side of the gas outlet structure 286.

The EUV radiation source 200 may further include a monitoring module 600 at a side of the collector 230 opposite to the fuel bucket 400. In some embodiments, the monitoring module 600 may include, for example, a camera or the like. In some embodiments, the monitoring module 600 may be utilized to monitor the plasma condition of the radiation source 200. The monitoring module 600 may be a droplet position detection module which may include one or more droplet imagers that provide an output indicative of the position of one or more droplets. For the EUV radiation source 200, the droplet generator 240 may have a control system operable in response to the signal from the monitoring module 600, to e.g., modify the release point, release timing and/or droplet modulation.

Figure 5B:
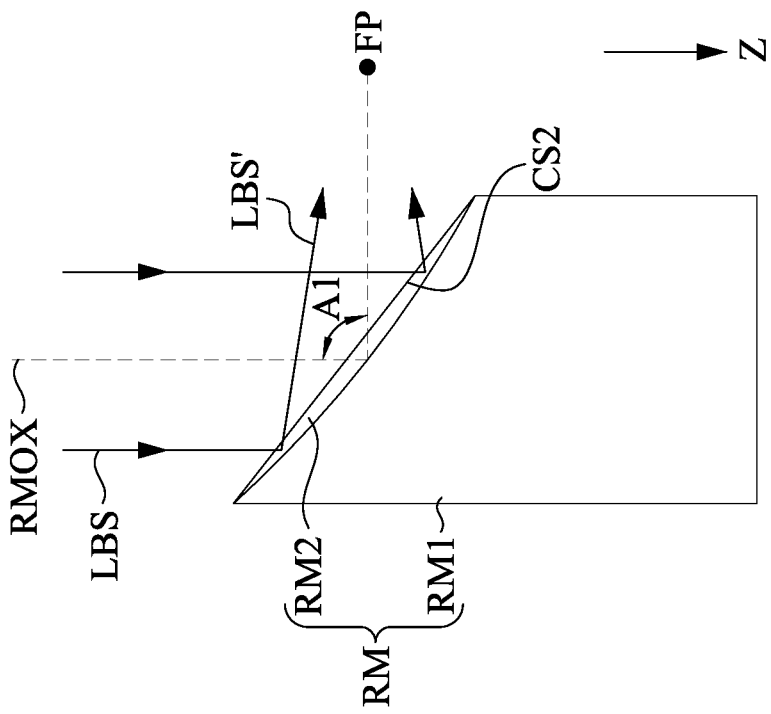
FIG. 5B is a cross sectional view of the mirror of FIG. 5A.
Figure 5A:
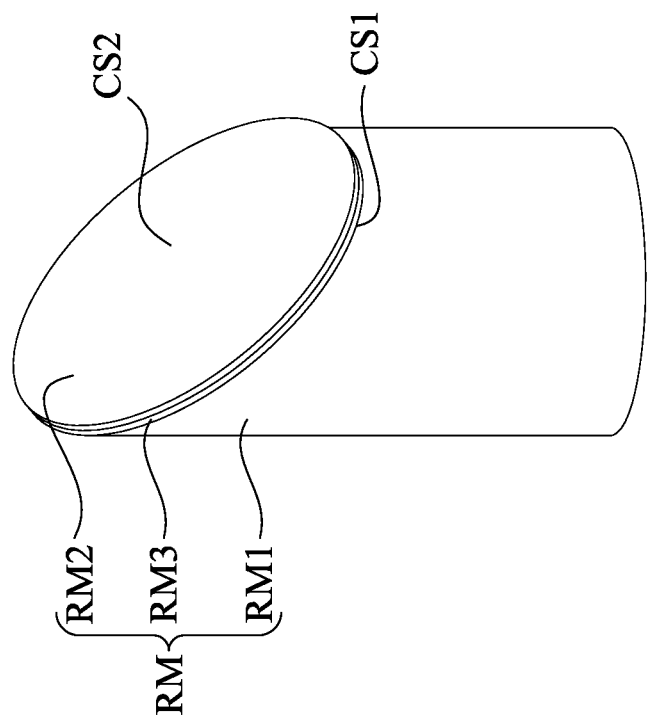
FIG. 5A is a schematic view of a reflective mirror according to some embodiments of the present disclosure.

FIG. 5A is a schematic view of a reflective mirror RM according to some embodiments of the present disclosure. In some embodiments, the reflective mirror RM is a concave mirror configured to concentrate laser toward a target region, thereby increasing intensity for melting tin more efficiently. For example, the reflective mirror RM is a parabolic mirror or a spherical mirror. The reflective mirror RM may have a body RM1 and a reflective layer RM2. In some embodiments, the body RM1 has a concave surface CS1, and the reflective layer RM2 is coated over the concave surface CS1 of the body RM1 and thereto having a concave surface CS2. In some embodiments, additional coating layer (e.g., the coating layer RM3) may be interposed between the body RM1 and the reflective layer RM2, thereby increasing reflectance.

Materials of the body RM1, the reflective layers RM2, and the coating layer RM3 may be highly heat-resistant, and not melt during the EUV lithography process. The reflective mirror RM may have a reflectance greater than 95% at a wavelength of the laser beam. For example, the body RM1 may be made of aluminum, other materials, etc. The reflective layer RM2 may be made of gold, silver, copper, other metals, tungsten, their alloy, non-metal coatings, or the combination thereof. The coating layer RM3 may be made of aluminum, gold, silver, copper, tungsten, other metals, their alloy, or the combination thereof, and the material of the coating layer RM3 may be different from that of the reflective layers RM2. In some examples, the body RM1 is made of aluminum, the coating layer RM3 is made of silver, and the reflective layer RM2 is made of gold. In some embodiments, the concave surface CS2 of the reflective mirror RM is a smooth surface for reflecting incident light, rather than a rough surface that scatters incident light.

FIG. 5B is a cross sectional view of the reflective mirror RM of FIG. 5A. In some embodiments, the reflective mirror RM may be an off-axis concave mirror, such as an off-axis parabolic mirror (OAP) or an off-axis spherical mirror. An optical axis RMOX of the off-axis concave mirror RM may be substantially parallel with a central ray axis of the incident light (e.g., stray laser beam LBS). For example, the optical axis RMOX of the off-axis concave mirror RM may be substantially parallel with the direction Z. In some embodiments, the optical axis RMOX of the off-axis concave mirror RM may overlap the optical axis OA of the collector 230 (referring to FIGS. 2A-2B). An off-axis concave mirror is referred to as a side section of a parent concave mirror (e.g., parent parabolic mirror or parent spherical mirror), while an on-axis concave mirror is referred to as a center section of the parent concave mirror. In some embodiments, a collimated light (e.g., stray laser beam LBS) that is incident to the off-axis concave mirror can be focused to a point, which is referred to as focal point FP. Their off-axis design may separate the focal point FP from the optical axis RMOX of the off-axis concave mirror RM. Depending on which section of a shape the off-axis mirror is replicating, the angle A1 between the focal point and the optical axis RMOX of the off-axis concave mirror RM can be large or small. As a result, compared with an on-axis concave mirror, the off-axis concave mirror has an advantage in that it allows a large angle between the incident light (e.g., stray laser beam LBS) and the focused light (e.g., the stray laser beam LBS'). For example, in some embodiments, the angle A1 of the off-axis concave mirror RM may be in a range from about 38 degrees to about 44 degrees.

In some other embodiments, the optical axis RMOX of the off-axis concave mirror RM may tilt with respect to the direction Z. For example, the optical axis RMOX of the off-axis concave mirror RM may not overlap the optical axis of the collector 230 (referring to FIGS. 2A-2B), such that the optical axis RMOX may tilt with respect to the central ray axis of the incident light (e.g., stray laser beam LBS). In some alternative embodiments, the reflective mirror RM may be an on-axis concave mirror, such as an on-axis parabolic mirror or an on-axis spherical mirror. For directing light toward a direction different from the direction Z, the optic axis of the on-axis concave mirror RM may tilt with respect to the direction Z.

Figure 5C:
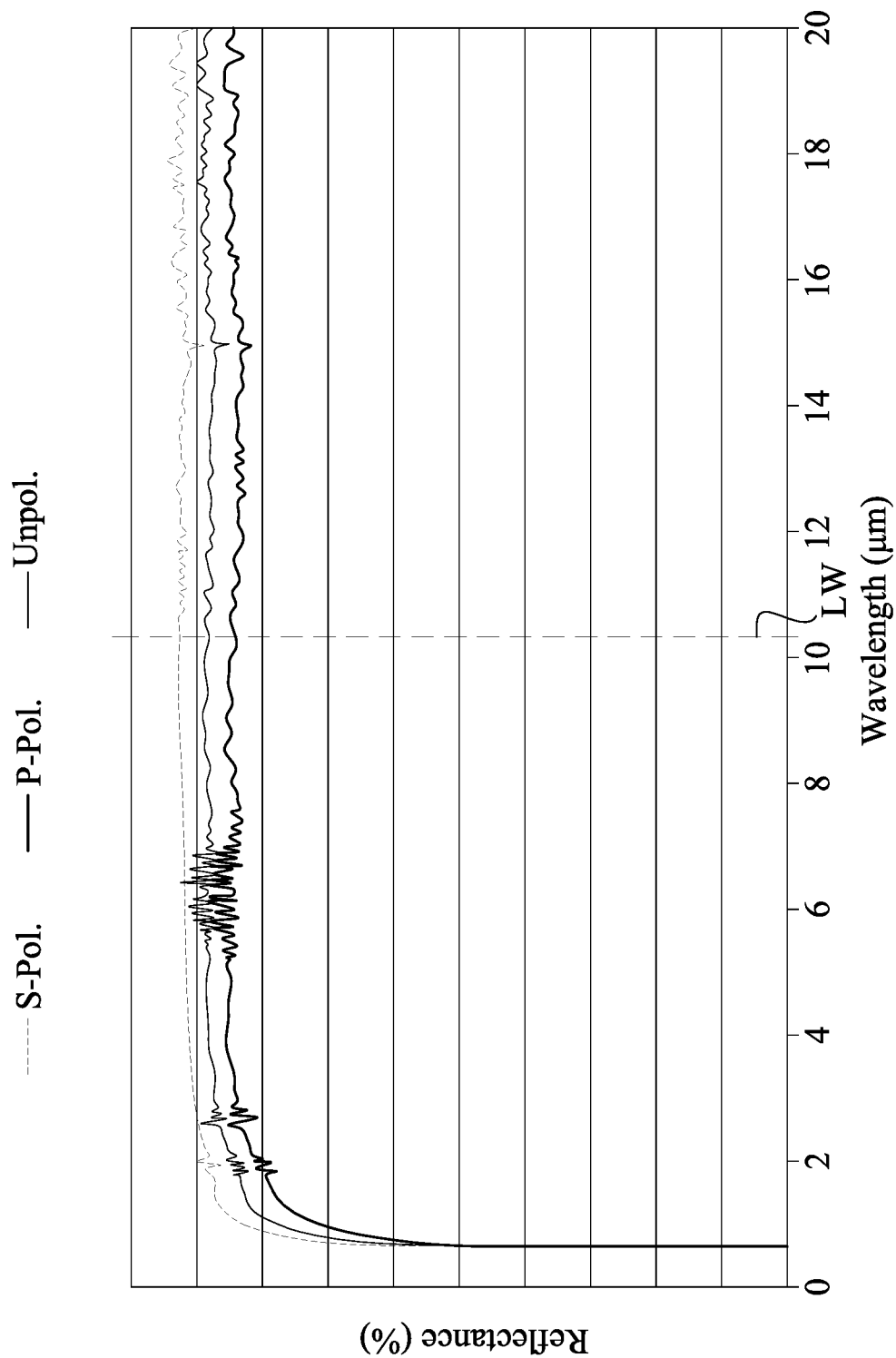
FIG. 5C is a graph showing the oblique reflectance versus wavelength of a mirror according to some embodiments of the present disclosure.

FIG. 5C is a graph showing the oblique reflectance versus wavelength of a reflective mirror for different polarized state according to some embodiments of the present disclosure. The exemplary reflective mirror in FIG. 5C may include a gold reflective layer RM2 (referring to FIGS. 5A and 5B). In FIG. 5C, the wavelength (μm) is shown on the horizontal axis, and the reflectance (%) is shown on the vertical axis. FIG. 5C shows that, for p-polarized light, the reflective mirror may have a reflectance higher than about 98% at a wavelength of the laser beam LB (referring to FIG. 5B), which is indicated as the laser wavelength LW. The reflective mirror RM may have a higher reflectance for a unpolarized light at the laser wavelength LW than the reflectance for p-polarized light at the laser wavelength LW. Furthermore, the reflective mirror RM may have a higher reflectance for s-polarized light at the laser wavelength LW than the reflectance for p-polarized light at the laser wavelength LW.

Figure 5D:
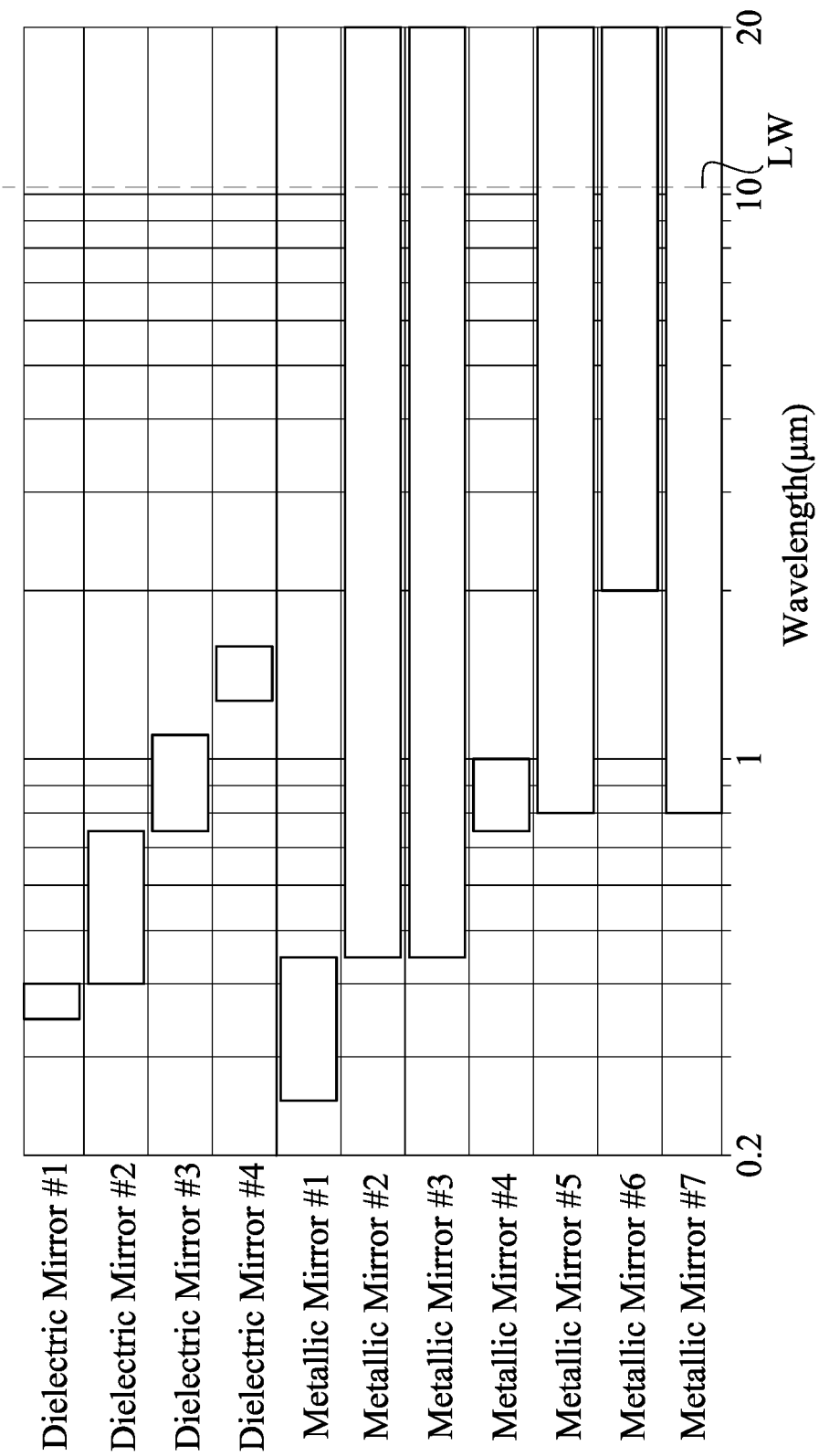
FIG. 5D is a graph showing broadband high-reflection (HR) coating ranges of metallic mirrors and dielectric mirrors according to some embodiments of the present disclosure.

FIG. 5D is a graph showing broadband high-reflection (HR) coating ranges of metallic mirrors and dielectric mirrors according to some embodiments of the present disclosure. In FIG. 5D, the wavelength is shown on the horizontal axis in logarithmic scale, and the various metallic mirrors and various dielectric mirrors are annotated on the vertical axis. The dielectric mirrors #1 to #4 may respectively offer high reflectance over four different spectral ranges. For example, the dielectric mirrors #1 to #4 are fused silica substrates with different multi-layer dielectric coatings. The metallic mirror #1 is a UV-enhanced aluminum mirror. The metallic mirrors #2 is a protected aluminum mirror. The metallic mirrors #3 is a protected silver mirror. The metallic mirrors #4 is an ultrafast-enhanced silver mirror. The metallic mirrors #5 is a protected gold mirror. The metallic mirrors #6 is a mid-infrared (MIR) enhanced gold mirror. The metallic mirrors #7 is an unprotected gold mirror.

As FIG. 5D shows, the HR coating ranges of the metallic mirrors #2, #3, #5, #6, and #7 cover the laser wavelength LW, while the HR coating ranges of the dielectric mirrors #1 to #4 and the metallic mirrors #1 and #4 does not cover the laser wavelength LW. That is, the metallic mirrors #2, #3, #5, #6, and #7 have high reflectance at the laser wavelength LW, and the dielectric mirrors #1 to #4 and the metallic mirrors #1 and #4 have lower reflectance at the laser wavelength LW than that of the metallic mirrors #2, #3, #5, #6, and #7. This indicates that the multi-layer dielectric coatings of dielectric mirrors may not extend to the laser wavelength LW. As such, comparing with dielectric mirrors, the metallic mirrors are more applicable to the EUV radiation source for reflecting the laser beam LB (referring to FIG. 5B).

Figure 6:
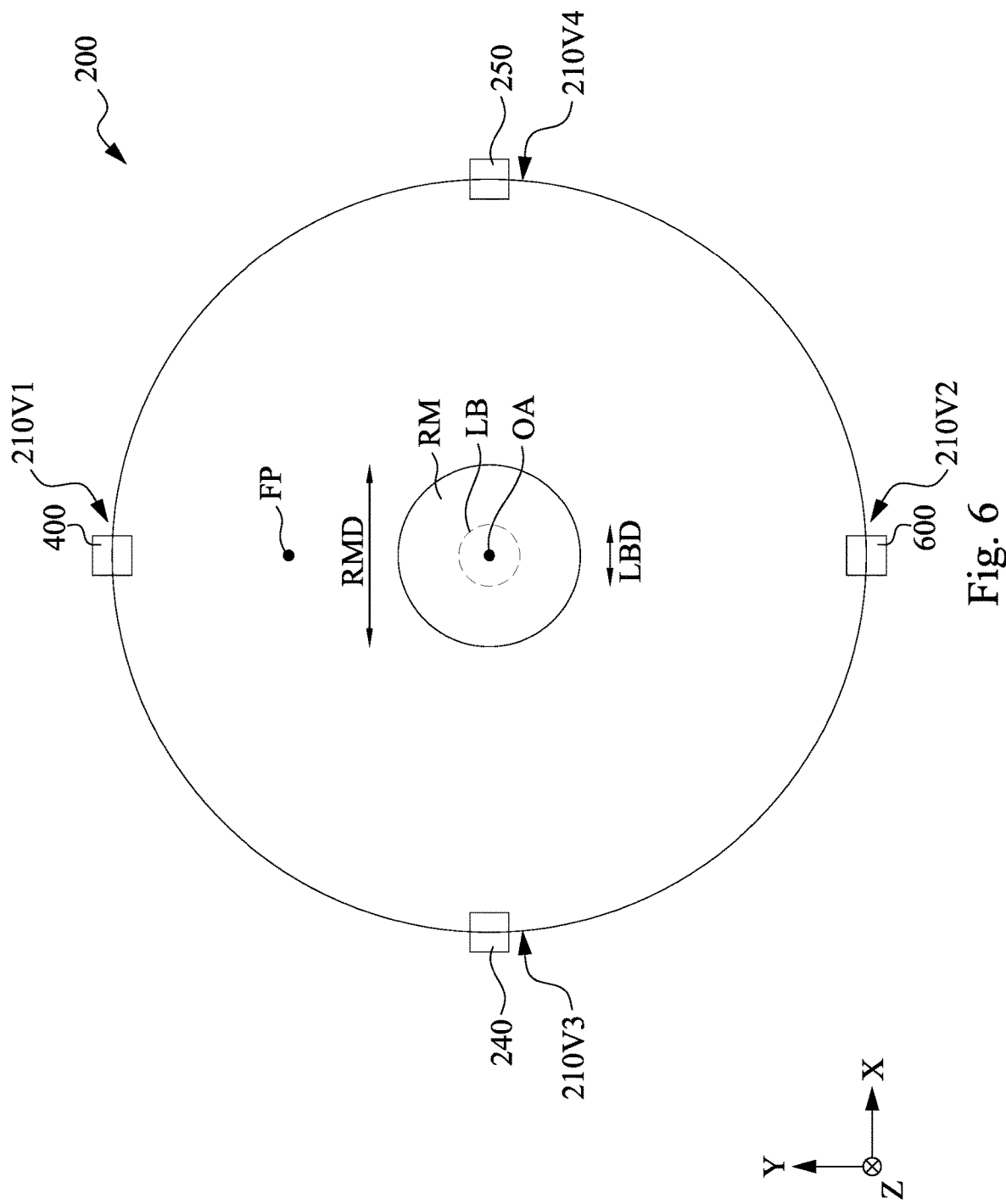
FIG. 6 illustrates a EUV radiation source viewed along a direction that the laser emits according to some embodiments of the present disclosure.

FIG. 6 illustrates a EUV radiation source 200 viewed along the direction Z that the laser beam LB emits according to some embodiments of the present disclosure. The reflective mirror RM may be a circle when viewed along the optic axis RMOX of the reflective mirror RM (referring to FIG. 5B), for example when viewed along the direction Z. In some embodiments, a diameter RMD of the circle of the reflective mirror RM is greater than a beam diameter LBD of the laser beam LB on the reflective mirror RM. For example, the diameter RMD of the circle of the reflective mirror RM is in a range from about 1.2 times the beam diameter LBD on the reflective mirror RM to about 1.5 times the beam diameter LBD on the reflective mirror RM. In other words, an area of the circle of the reflective mirror RM is greater than a beam size of the laser beam LB. Through the configuration, the reflective mirror RM can obscure the laser beam LB from emitting out of the EUV vessel.

For clear illustration, the vessel 210 is illustrated as having four edges 210V1-210V4, in which the edges 210V1 and 210V2 are opposite to each other, and edges 210V3 and 210V4 are opposite to each other. The edge 210V1 is adjacent to the fuel bucket 400, the edge 210V2 is adjacent to the monitoring module 600, the edge 210V3 is adjacent to the droplet generator 240, and the edge 210V4 is adjacent to the droplet catcher 250. As aforementioned, for facilizing tin collection, the edge 210V1 is at a position lower than the edges 210V3 and 210V4, and the edge 210V2 is at a position higher than the edges 210V3 and 210V4.

In some embodiments of the present disclosure, by reflection and focus function of the reflective mirror RM, the stray laser beam LBS' (referring to FIGS. 4A and 4B) may be directed a region near the edge 210V1 of the vessel 210, while regions near edges 210V2-210V4 of the vessel 210 are free of the stray laser beam LBS' (referring to FIGS. 4A and 4B). For example, a light intensity of the laser beam at the region near the edge 210V1 of the vessel 210 is greater than the light intensities of the laser beam at the regions near edges 210V2-210V4 of the vessel 210. In other words, by using the reflective mirror RM to reflect the laser, and the heat of the laser is unevenly distributed to regions near different edges of the vessel. For example, the region near the edge 210V1 of the vessel 210 receives more heat than the regions near edges 210V2-210V4 of the vessel 210, such that a temperature of the region near the edge 210V1 of the vessel 210 is elevated more than temperatures of the regions near edges 210V2-210V4 of the vessel 210. As a result, the resulted temperature of the region near the edge 210V1 of the vessel 210 is higher than the resulted temperatures of the regions near edges 210V2-210V4 of the vessel 210, thereby heating the drip pins DP (referring to FIGS. 2B and 4B) and preventing the drip pins DP (referring to FIGS. 2B and 4B) from clogging. In some embodiments where the reflective mirror RM is an off-axis mirror, the focal point FP of the reflective mirror RM may be between the edge 210V1 and the central ray axis of the stray laser beam LBS (or the optic axis OA of the collector).

Figure 7:
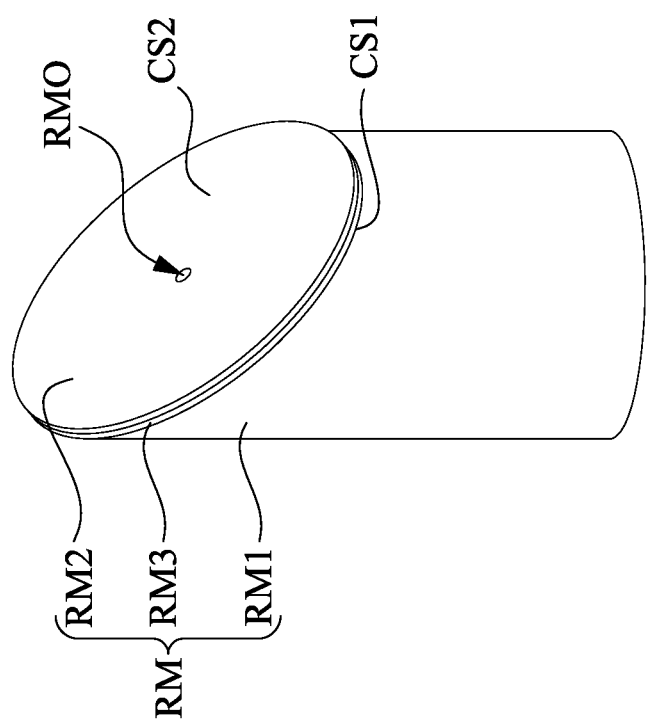
FIG. 7 is a schematic view of a reflective mirror according to some embodiments of the present disclosure.

FIG. 7 is a schematic view of the reflective mirror RM according to some embodiments of the present disclosure. The present embodiments are similar to those shown in the embodiments of FIGS. 5A and 5B, except that the reflective mirror RM may have a through hole RMO therein. In some embodiments, the through hole RMO of the reflective mirror RM may be used for connection between horizontal obscuration bar HO (referring to FIGS. 2A-2B) and other devices. In some other embodiments, the through hole RMO of the reflective mirror RM may allow transmission of light. Other details of the present embodiments are similar to those illustrated in the embodiments of FIGS. 5A and 5B, and therefore not repeated herein.

Figure 8A:
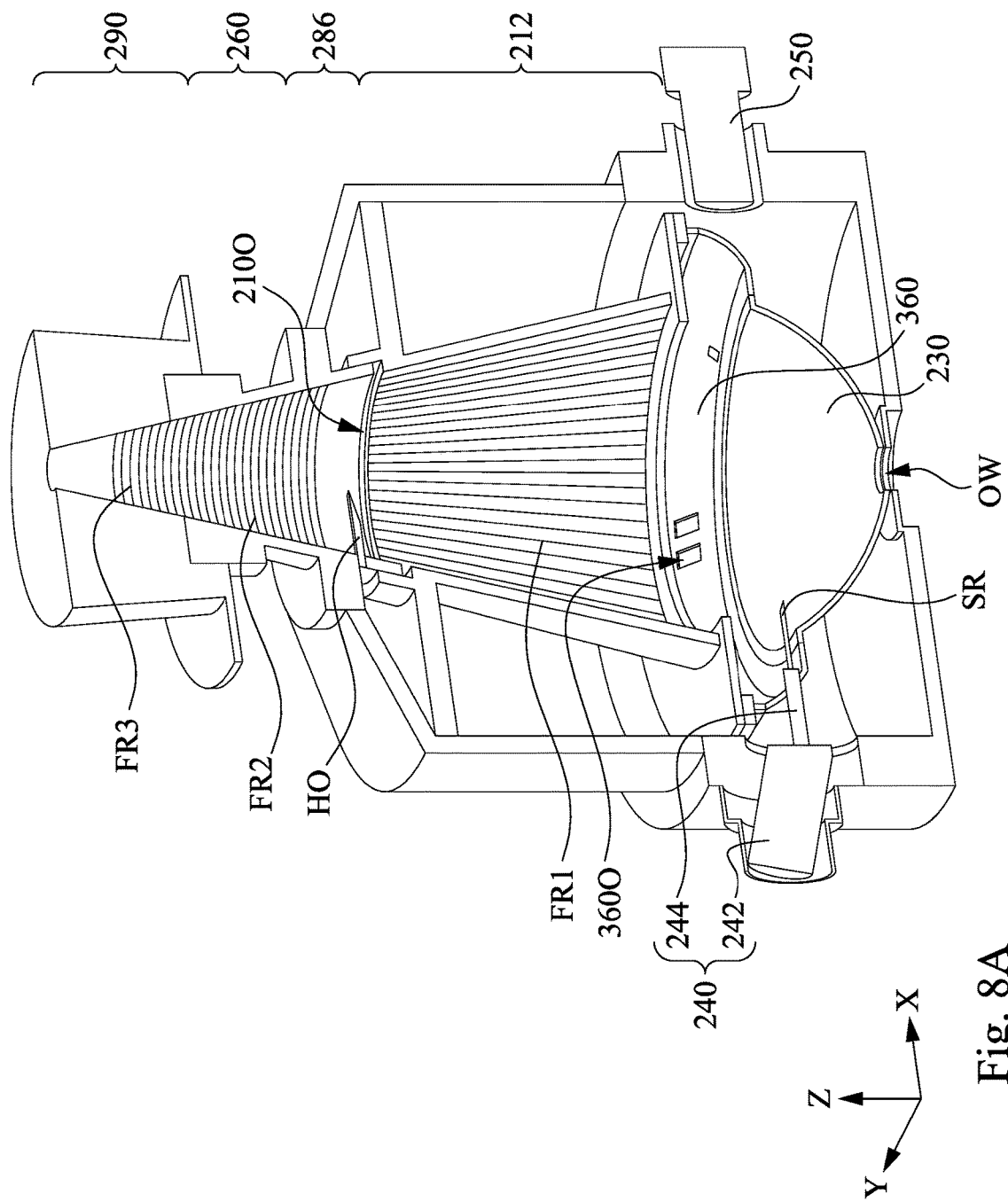
FIG. 8A is a stereo schematic view of an EUV radiation source according to some embodiments of the present disclosure.
Figure 8B:
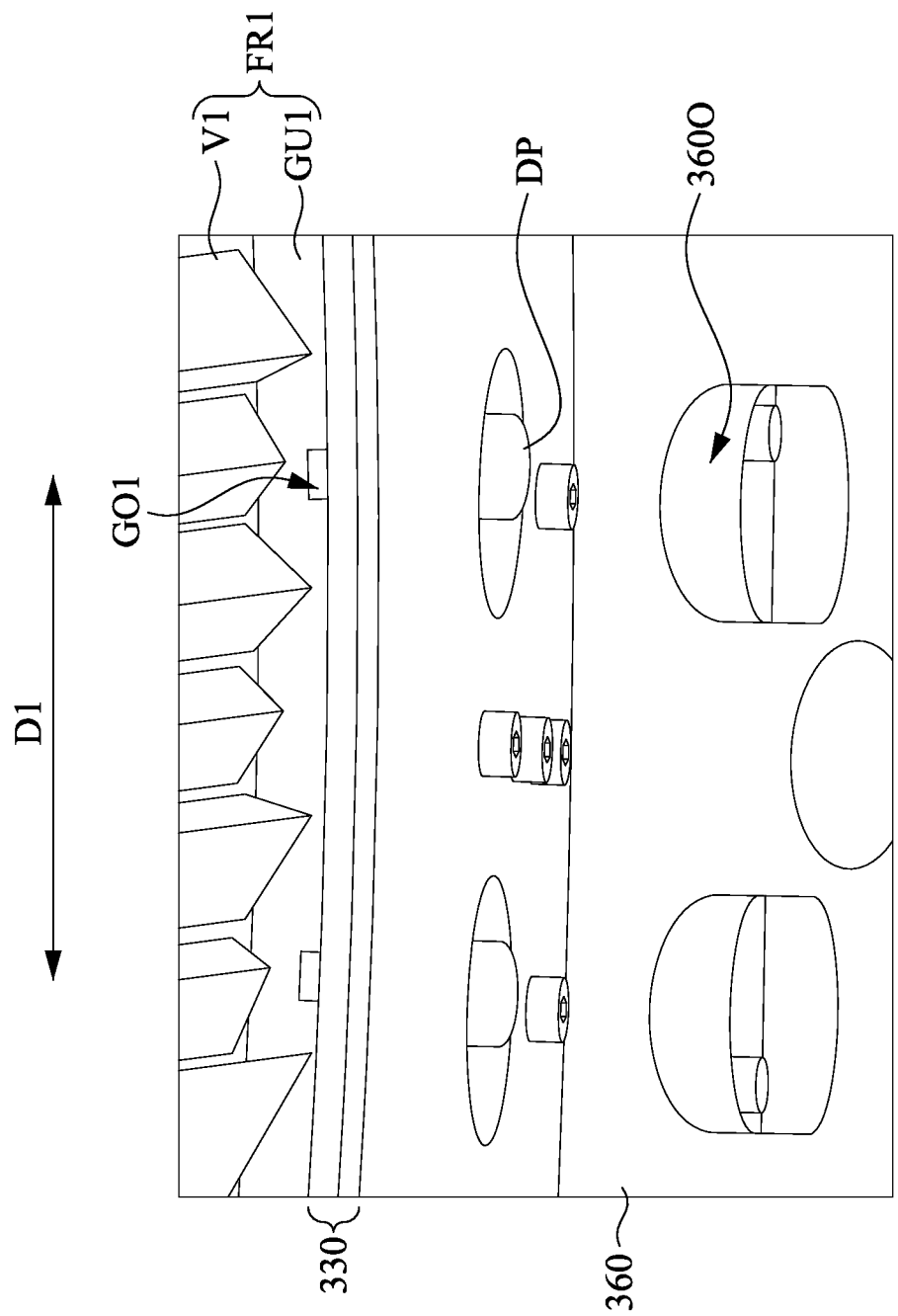
FIG. 8B shows an enlarged portion of the EUV radiation source of FIG. 8A.

FIG. 8A is a stereo schematic view of an EUV radiation source 200 according to some embodiments of the present disclosure. The pack structure 360 may surrounds the collector 230 and have two inlets 3600. FIG. 8B shows an enlarged portion of the EUV radiation source 200 of FIG. 8A. As aforementioned, in some embodiments, while two drip pins DP are disposed below the gutter structure GU1, the gutter structure GU1 has two drain holes GO1, and the pack structure 360 has two inlets 3600 below the drip pins DP. In some embodiments, a size of the inlets 3600 of the pack structure 360 is greater than a size of the hole of the drip pins DP, which facilitating dripping liquids down toward the fuel bucket.

Reference is made back to FIG. 8A. In some embodiments, in addition to the fuel receiving assembly FR1, the radiation source 200 may further include other fuel receiving elements on inner sidewalls of the vessel 210. For example, the radiation source 200 may include a fuel receiving assembly FR2 near the lower cone structure 260 and a fuel receiving assembly FR3 near the IF-cap module 290. The fuel receiving assembly FR2 may include vanes V2. The shapes and densities of the vanes V1 and V2 of the fuel receiving assembly FR1 and FR2 may be different from each other. For example, a density of the vanes V2 of the fuel receiving assembly FR2 is greater than a density of the vanes V1 of the fuel receiving assembly FR1. In some embodiments, the vanes V2 of the fuel receiving assembly FR2 may be spiral that laterally guides the liquid debris. The fuel receiving assembly FR3 may include suitable coating layers. In some embodiments, the fuel receiving assembly FR3 may also include vanes that are spiral that laterally guides the liquid debris. Through these fuel receiving assemblies FR1-FR3, the liquid debris may be received and directed to flow into the fuel bucket 400 (referring to FIGS. 2B and 4B).

The radiation source 200 may include a shroud SR below a port of the cover 212 that receives the droplet generator 240. The shroud SR may be made of suitable material, such as ceramics. The shroud SR may extend substantially along the X direction that the droplet generator 240 generates the droplet of the fuel material TD substantially along. The shroud SR may obscure some unshaped fuel material (e.g., not in the form of droplet) released from the droplet generator 240, thereby protecting the collector 230 from being contaminated by the unshaped fuel material.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that a method is proposed for addressing drip pins clogging and reducing Tin contamination, thereby improving EUV tool performance. Another advantage is that by addressing the drip pins clogging, collector longevity can be achieved. Still another advantage is that using stray laser for heating the drip pins can save wasted laser, and no extra power needed, which is beneficial for energy recycle. Still another advantage is that by using laser heating, the area to be heated is narrowed down such that the solid tin removal will be more efficient and effective. Still another advantage is that the reflective mirror can be supported by the horizontal obscuration bar.

According to some embodiments of the present disclosure, a radiation source apparatus includes a vessel, a laser source, a collector, and a reflective mirror. The vessel has an exit aperture. The laser source is at one end of the vessel and configured to excite a target material to form a plasma. The collector is disposed in the vessel and configured to collect a radiation emitted by the plasma and to direct the collected radiation to the exit aperture of the vessel. The reflective mirror is in the vessel and configured to reflect the laser beam toward an edge of the vessel.

According to some embodiments of the present disclosure, a radiation source apparatus includes a vessel, a laser source, a collector, a fuel receiving assembly, at least one drip pin, and a reflective mirror. The vessel has an exit aperture. The laser source is disposed at one end of the vessel and configured to emit a laser beam to excite a target material to form a plasma. The collector is disposed in the vessel and configured to collect a radiation emitted by the plasma and to direct the collected radiation to the exit aperture of the vessel. The fuel receiving assembly surrounds the vessel. The drip pin is connected to a bottom of the fuel receiving assembly. The reflective mirror is located in the vessel and configured to reflect the laser beam toward the at least one drip pin.

According to some embodiments of the present disclosure, a method includes generating a target droplet to a zone of excitation in a vessel; emitting a laser beam toward the zone of excitation, such that the target droplet is heated by the laser beam to generate radiation; and after the laser beam passes the zone of excitation, directing the laser beam toward a first edge of the vessel.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A radiation source apparatus, comprising:
   a vessel having an exit aperture;
   a laser source disposed at an end of the vessel and configured to emit a laser beam to excite a target material to form a plasma;

a collector disposed in the vessel and configured to collect a radiation emitted by the plasma and to direct the collected radiation to the exit aperture of the vessel; and a reflective mirror in the vessel and configured to reflect the laser beam toward an edge of the vessel.

2. The radiation source apparatus of claim 1, further comprising:
a horizontal obscuration bar in the vessel and supporting the reflective mirror.

3. The radiation source apparatus of claim 1, further comprising:
a fuel bucket configured to receive a residue of the plasma, wherein the laser beam is reflected also toward the fuel bucket.

4. The radiation source apparatus of claim 1, further comprising:
a fuel receiving assembly surrounding the vessel; and
a drip pin connected to a bottom of the fuel receiving assembly, wherein the laser beam is reflected also toward the drip pin.

5. The radiation source apparatus of claim 1, wherein the reflective mirror is directly between the exit aperture of the vessel and an output window of the collector.

6. The radiation source apparatus of claim 1, wherein the reflective mirror is a concave mirror.

7. The radiation source apparatus of claim 1, wherein the reflective mirror has a reflectance greater than 95% at a wavelength of the laser beam.

8. The radiation source apparatus of claim 1, wherein the reflective mirror is an off-axis parabolic mirror.

9. The radiation source apparatus of claim 1, wherein the reflective mirror has a gold reflective layer.

10. A radiation source apparatus, comprising:
a vessel having an exit aperture;
a laser source disposed at one end of the vessel and configured to emit a laser beam to excite a target material to form a plasma;
a collector disposed in the vessel and configured to collect a radiation emitted by the plasma and to direct the collected radiation to the exit aperture of the vessel;
a fuel receiving assembly surrounding the vessel;
at least one drip pin connected to a bottom of the fuel receiving assembly; and
a reflective mirror located in the vessel and configured to reflect the laser beam toward the at least one drip pin.

11. The radiation source apparatus of claim 10, wherein two of the drip pins are connected to the bottom of the fuel receiving assembly.

12. The radiation source apparatus of claim 11, wherein the laser beam reflected by the reflective mirror has a width greater than a center-to-center distance between the drip pins.

13. The radiation source apparatus of claim 10, wherein the fuel receiving assembly comprises:
a plurality of vanes around the vessel; and
a gutter structure below the vanes, wherein the gutter structure has at least one drain hole fluidly communicated with the at least one drip pin.

14. The radiation source apparatus of claim 10, further comprising:
a fuel bucket below the drip pin.

15. The radiation source apparatus of claim 14, further comprising:
at least one chimney between the drip pin and the fuel bucket.

16. A method, comprising:
generating a target droplet to a zone of excitation in a vessel;
emitting a laser beam toward the zone of excitation, such that the target droplet is heated by the laser beam to generate radiation; and
after the laser beam passes the zone of excitation, directing the laser beam toward a first edge of the vessel.

17. The method of claim 16, wherein directing the laser beam toward the first edge of the vessel is performed by using a reflective mirror.

18. The method of claim 17, wherein the reflective mirror is a concave mirror.

19. The method of claim 16, wherein directing the laser beam toward the first edge of the vessel is performed such that a second edge of the vessel opposite to the first edge of the vessel is free of the laser beam.

20. The method of claim 16, wherein the first edge of the vessel is at a position lower than a second edge of the vessel opposite to the first edge of the vessel.

* * * * *